(12) United States Patent
Chen

(10) Patent No.: US 9,147,664 B2
(45) Date of Patent: Sep. 29, 2015

(54) SEMICONDUCTOR PACKAGE

(71) Applicant: MEDIATEK Inc., Hsin-Chu (TW)

(72) Inventor: Nan-Jang Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/051,548

(22) Filed: Oct. 11, 2013

(65) Prior Publication Data

US 2015/0102495 A1    Apr. 16, 2015

(51) Int. Cl.

| | |
|---|---|
| H01L 23/48 | (2006.01) |
| H01L 23/52 | (2006.01) |
| H01L 29/40 | (2006.01) |
| H01L 23/00 | (2006.01) |
| H01L 23/482 | (2006.01) |
| H01L 23/31 | (2006.01) |

(52) U.S. Cl.
CPC ............ *H01L 24/30* (2013.01); *H01L 23/3107* (2013.01); *H01L 23/4824* (2013.01)

(58) Field of Classification Search
CPC .. H01L 23/3107; H01L 23/4824; H01L 24/30
USPC ........................................................ 257/774
See application file for complete search history.

(56) References Cited

U.S. PATENT DOCUMENTS

| | | | |
|---|---|---|---|
| 6,833,611 B2 | 12/2004 | Liu et al. | |
| 6,833,615 B2 | 12/2004 | Geng et al. | |
| 7,009,297 B1 | 3/2006 | Chiang et al. | |
| 2002/0047772 A1 | 4/2002 | Chang et al. | |
| 2004/0032019 A1 | 2/2004 | Liu et al. | |
| 2005/0035448 A1 | 2/2005 | Hsu et al. | |
| 2006/0134828 A1 | 6/2006 | Kummerl | |
| 2008/0305579 A1 | 12/2008 | Lin et al. | |
| 2010/0295168 A1 | 11/2010 | Feng et al. | |
| 2014/0240945 A1* | 8/2014 | Hosseini et al. ............... | 361/782 |

FOREIGN PATENT DOCUMENTS

| | | | | |
|---|---|---|---|---|
| CN | 101083246 | * | 12/2007 | ............ H01L 23/498 |
| CN | 101083246 A | | 12/2007 | |
| CN | 101728368 A | | 6/2010 | |

OTHER PUBLICATIONS

International Search Report dated Jul. 8, 2014.
Full English (machine) translation of CN101083246 (Published Dec. 5, 2007).
English Abstract translation of CN101728368 (Published Jun. 9, 2010).
"Spirent Communications"; Performance Analysis Broadband Division—Honolulu Development Center; PCB CAD Design Guidelines; Document 001-7001-001;Oct. 18, 2002.

\* cited by examiner

*Primary Examiner* — David S Blum
(74) *Attorney, Agent, or Firm* — .McClure, Qualey & Rodack, LLP

(57) ABSTRACT

A semiconductor package is provided. The semiconductor package includes a substrate, a first pad, a second, a first conductive element, a surface mount device, a first bonding wire and a molding compound layer. The first pad, the second pad, and the first conductive element are formed on the substrate. The surface mount device is mounted on the first pad and the second pad. The first bonding wire electrically connects the first conductive element and the first pad. The molding compound layer encapsulates the substrate, the first pad, the second pad, the first conductive element, the bonding wire and the surface mount device.

14 Claims, 3 Drawing Sheets

SEMICONDUCTOR PACKAGE

BACKGROUND

1. Technical Field

The disclosure relates in general to a package structure, and more particularly to a semiconductor package.

2. Description of the Related Art

In the electronics industry, high integration and multiple functions with high performance become essential for new products. And meanwhile, high integration may cause higher manufacturing cost, since the manufacturing cost is in proportional to its size. Therefore, demanding on miniaturization of integrated circuit (IC) packages has become more and more critical.

System-in-package (SiP) is now the fastest growing semiconductor package technology since it is a cost-effective solution to high-density system integration in a single package. In a system-in-package structure, various device components are integrated in a single semiconductor package to reduce the size. Accordingly, there exists a need to provide a semiconductor package to overcomes, or at least reduces the above-mentioned problems.

SUMMARY

In one embodiment of the invention, a semiconductor package is provided. The semiconductor package includes a substrate, a first pad, a second, a first conductive element, a surface mount device, a first bonding wire and a molding compound layer. The first pad, the second pad, and the first conductive element are formed on the substrate. The surface mount device is mounted on the first pad and the second pad. The first bonding wire electrically connects the first conductive element and the first pad. The molding compound layer encapsulates the substrate, the first pad, the second pad, the first conductive element, the bonding wire and the surface mount device.

Yet, in another embodiment of the invention, a semiconductor package is provided. The semiconductor package includes a substrate, a first pad, a second pad, a via-plug, a surface mount device and a molding compound layer. The first pad and the second pad are formed on the substrate. The via-plug is formed in the substrate, covered by a solder resistance layer, and located in a space between the first pad and the second pad. Further the via-plug is electrically connected to the second pad. The surface mount device is mounted on the first pad and the second pad. The molding compound layer encapsulates the substrate, the first pad, the second pad, the solder resistance layer and the surface mount device.

DETAILED DESCRIPTION

Figure 1A:
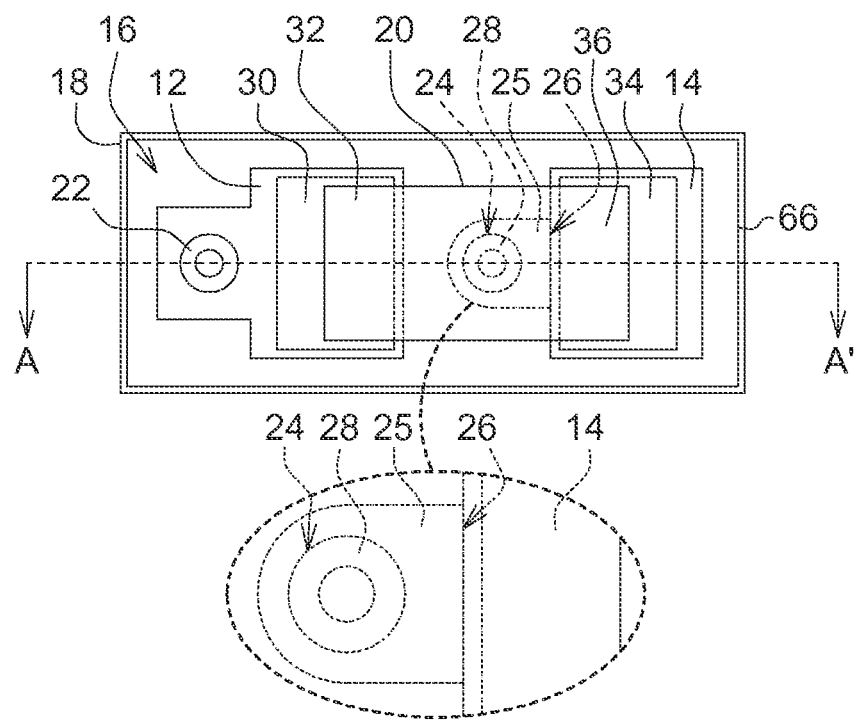
FIG. 1A illustrates a top view of a semiconductor package in one embodiment of the invention.
Figure 1B:
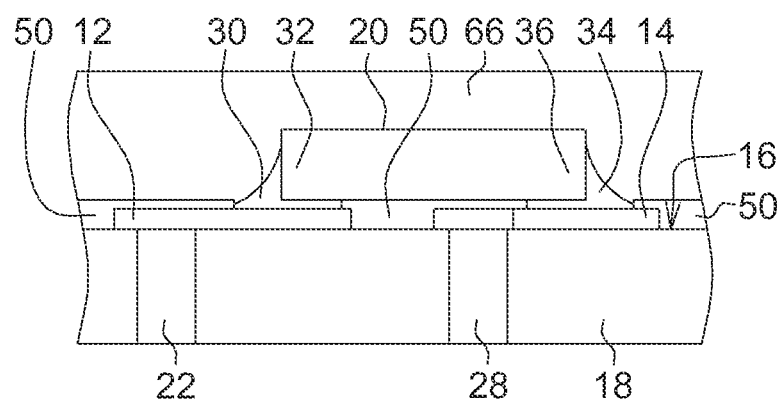
FIG. 1B illustrates a cross-section view of a semiconductor package in one embodiment of the invention.

FIG. 1A illustrates a top view of a semiconductor package in one embodiment of the invention. FIG. 1B illustrates a cross-section view of the semiconductor package drawn along AA' line in FIG. 1A.

Referring to FIG. 1A and FIG. 1B, a first pad 12 and a second pad 14 are disposed on a surface 16 of a substrate 18. The substrate 18 may be a printed circuit board (PCB), a semiconductor carrier board, or a package substrate such as a ball grid arrays (BGA) substrate or a pin grid array (PGA) substrate.

Referring to FIG. 1A and FIG. 1B, via-plugs 22, 28 passing through the substrate 18 are respectively electrically connected to the first pad 12 and the second pad 14, and may be electrically connected to conductive elements such as traces (not shown) on at least one other surface of the substrate 18. In one embodiment, the via-plugs 22, 28 passing through the whole substrate 18 are formed by a method comprising forming openings in the substrate by drilling, etching or emitting laser, and then filling the openings with a conductive material e.g. copper, aluminum, etc.

In one embodiment, the via-plug 28 is formed in a space between the first pad 12 and the second pad 14. And the via-plug 28 electrically connects to the second pad 14. Therefore, the space between the first pad 12 and the second pad 14 is used. It results in facilitating miniaturization of IC packages, or increasing of an extra area for additional elements or devices. Therefore, design flexibility of the semiconductor package is enhanced.

In one embodiment, the via-plug 28 is electrically connected to the second pad 14 through a connecting member 25, as shown in an enlarge view in FIG. 1A. Referring to FIGS. 1A and 1B, the connection member 25 may be formed together with the second pad 14. The via-plug 28 and the connection member 25 are covered by a solder resistance layer 50 (shown in FIG. 1B, but not shown in FIG. 1A for the sake of brevity). At least a portion of the first pad 12 and the second pad 14 is not covered by the solder resistance layer 50 (FIG. 1B) so as to reveal openings. In embodiments, the via-plug 28 and the second pad 14 are respectively formed in non-overlapping areas of the substrate 18, as shown in FIG. 1A. In other word, the via-plug 28 is independent from the second pad 14. An outline 24 of the via-plug 28 is generally a circle; an outline 26 of the second pad 14 is generally a square, but not limited thereto. The outline 24 of the via-plug 28 is independent from the outline 26 of the second pad 14. In other words, the outline 24 and the outline 26 are non-overlapping. In one embodiment, the outline 24 of the via-plug 28 and the outline 26 of the second pad 14 are separated by the connecting member 25.

Referring to FIGS. 1A and 1B, a surface mount device (SMD device) 20 may be mounted on the first pad 12 and the second pad 14 on the surface 16 of the substrate 18. The SMD device 20 may be a passive device e.g. capacitor, resistor, inductor or electrostatic discharge component (ESD). The SMD device 20 includes a first electrode 32 and a second electrode 36, which are respectively electrically connected to the first pad 12 through a first solder 30 and connected to the second pad 14 through a second solder 34. The SMD device 20 overlaps with the via-plug 28. In other word, the via-plug 28 is placed under the SMD device 20.

For example, the SMD device 20 is mounted on the surface 16 of the substrate 18 by a reflow process. In the beginning of the reflow process, a solder paste layer is printed in the openings defined by the solder resistance layer 50 on the first pad 12 and the second pad 14. The SMD device 20 then is mounted on the surface 16 by putting the first electrode 32 of the SMD device 20 on the solder paste layer which is printed on the first pad 12, and putting the second electrode 36 of the SMD device 20 on the solder paste layer which is printed on the second pad 14. Thereafter, the substrate 18 and the SMD device 20 are heated by a reflow oven. During the heating process, the solder past layer is melted to form the first solder 30 and the second solder 34. After cooling down, the first solder 30 and the second solder 34 firmly fix the SMD device 20 to the first pad 12 and the second pad 14.

In one embodiment, one of the first pad 12 and the second pad 14 is a power pad, and the other one is a ground pad. For example, the first pad 12 is the power pad, and the second pad 14 is the ground pad.

A molding compound layer 66 covers the substrate 18 and structures on the surface 16 of the substrate 18, so that various components such as the first pad 12, the second pad 14, the SMD device 20 etc., are encapsulated and protected from mechanical and/or chemical damages, e.g. moisture, oxidization, external shocks and vibrations. The molding compound layer 66 may include an epoxy resin or other suitable materials. In embodiments, the semiconductor package also includes other components not shown in FIGS. 1A and 1B.

Figure 2A:
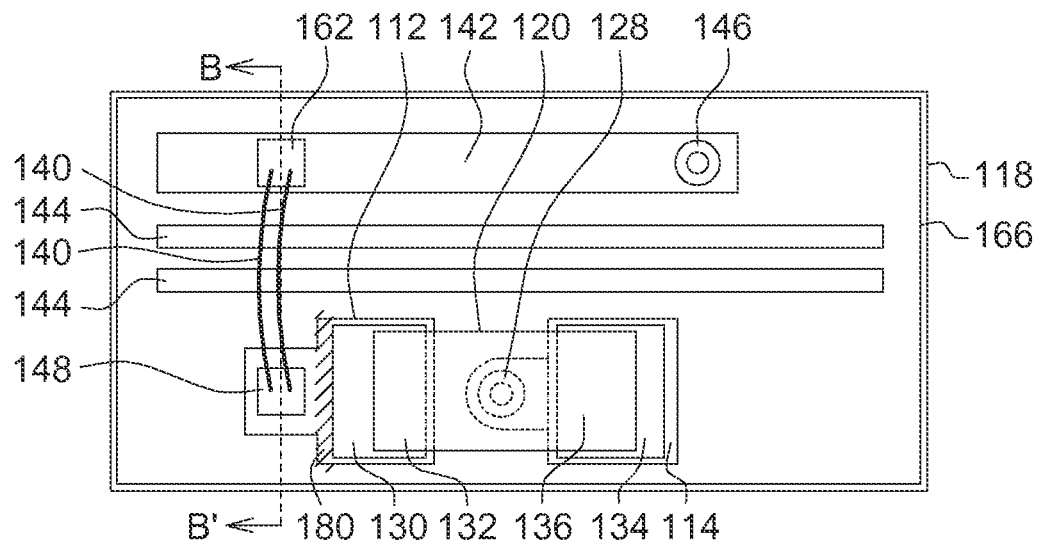
FIG. 2A illustrates a top view of a semiconductor package in one embodiment of the invention.
Figure 2B:
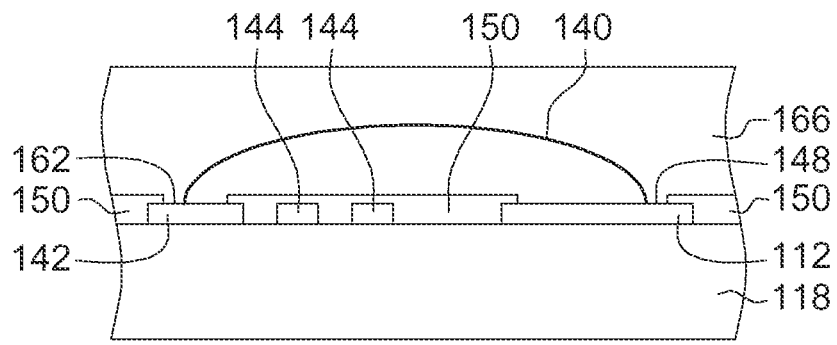
FIG. 2B illustrates a cross-section view of a semiconductor package in one embodiment of the invention.

FIG. 2A illustrates a top view of a semiconductor package in another embodiment of the invention. FIG. 2B illustrates a cross-section view of the semiconductor package drawn along BB' line in FIG. 2A.

The semiconductor package as shown in FIG. 2A includes a substrate 118. The substrate 118 may be a printed circuit board (PCB), a semiconductor carrier board, or a package substrate such as a ball grid arrays (BGA) substrate or a pin grid array (PGA) substrate. A surface mount device (SMD device) 120 may be mounted on a first pad 112 and a second pad 114 on the substrate 118 through a first solder 130 and a second solder 134, respectively electrically connected between a first electrode 132 of the SMD device 120 and the first pad 112 and between a second electrode 136 of the SMD device 120 and the second pad 114. The SMD device 120 may be a passive device e.g. capacitor, resistor, inductor or electrostatic discharge component (ESD).

As shown in FIG. 2A, the semiconductor package further includes a first conductive element 142 and maybe a second conductive element 144 formed on the substrate 118. The first conductive element 142 is formed physically independent from the first pad 112. The second conductive element 144 may be formed in between the first pad 112 and the first conductive element 142, and are separated from etch other, for example by an insulating layer such as a solder resistance layer 150 (FIG. 2B).

The first conductive element 142 electrically connects to a via-plug 146 formed through the substrate 118, and electrically connects to the first pad 112 through at least one bonding wire 140 lying across the second conductive element 144. In one embodiment, two opposing ends of the bonding wire 140 are respectively bonded on a first bonding area 148 connecting to the first pad 112 and a second bonding area 162 of the first conductive element 142. The first bonding area 148 and the second bonding area 162 are defined by the solder resistance layer 150 (shown in FIG. 2B, but not shown in FIG. 2A for the sake of brevity) which covers a portion of the substrate 118 and reveals some openings for soldering or wire bonding. The via-plugs 146, 128 (FIG. 2A) are formed through the substrate 118 and respectively electrically connected to the first conductive element 142 and the second pad 114.

As disclosed above, the SMD device 120 is mounted on the substrate 118 by reflow process. In order to prevent a solder paste material from flowing into the first bonding area 148, the solder resistance layer (not shown) may be used to cover an area 180 between the first bonding area 148 and the first pad 112.

In one embodiment, the first conductive element 142 and the second conductive element 144 may be a trace, a pad, a ring, or a finger. One of the first conductive element 142 and the second pad 114 is used for distributing power signal, and the other of the first conductive element 142 and the second pad 114 is used for connecting to a ground potential. For example, the second pad 114 is a ground pad. The first conductive element 142 is a power trace, a power ring, a power plane, or a power finger, electrically connected to the via-plug 146 or to the bonding pad on a semiconductor (not shown in FIG. 2A for the sake of brevity). In additional, the second conductive element 144 is a signal trace for distributing signal.

A molding compound layer 166 encapsulates structures on the substrate 118 such as the first pad 112, the second pad 114, the SMD device 120, the first conductive element 142, the second conductive element 144, etc., to protect them from mechanical and/or chemical damages, e.g. moisture, oxidization, external shocks and vibrations.

Figure 3A:
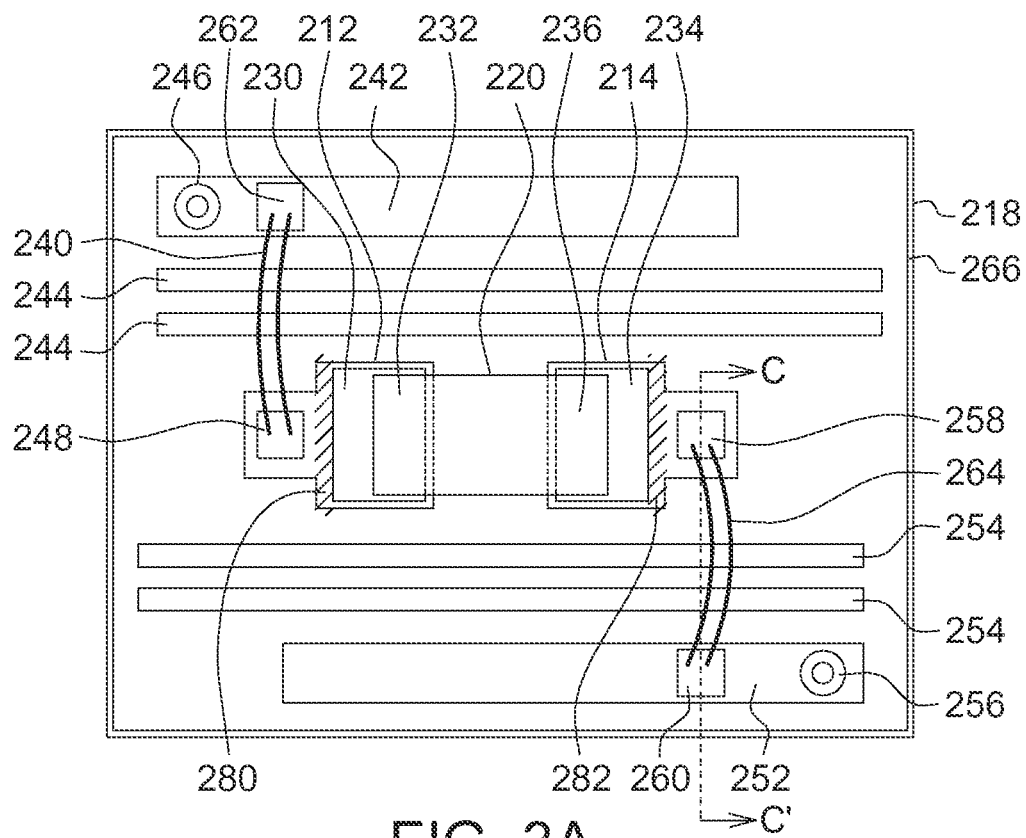
FIG. 3A illustrates a top view of a semiconductor package in one embodiment of the invention.
Figure 3B:
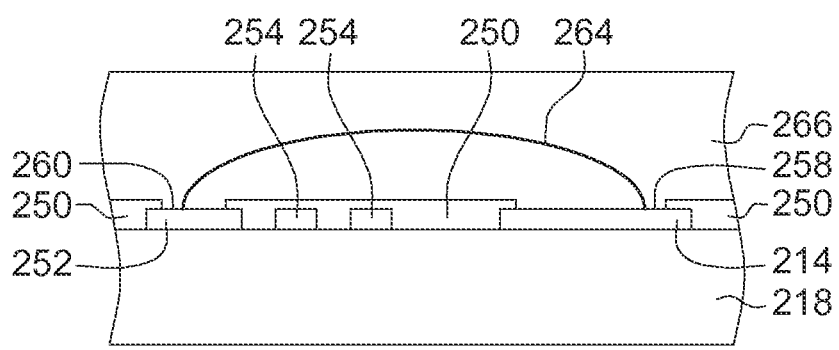
FIG. 3B illustrates a cross-section view of a semiconductor package in one embodiment of the invention.

FIG. 3A illustrates a top view of a semiconductor package in one embodiment of the invention. FIG. 3B illustrates a cross-section view of the semiconductor package drawn along CC' line in FIG. 3A.

The semiconductor package as shown in FIG. 3A includes a substrate 218. A surface mount device (SMD device) 220 may be mounted on a first pad 212 and a second pad 214 on the substrate 218 through a first solder 230 and a second solder 234, respectively electrically connected between a first electrode 232 of the SMD device 220 and the first pad 212 and between a second electrode 236 of the SMD device 220 and the second pad 214.

As shown in FIG. 3A, the semiconductor package further includes a first conductive element 242, a second conductive element 244, a third conductive element 252, and a fourth conductive element 254, formed on the substrate 218. The second conductive elements 244 are formed between the first pad 212 and the first conductive element 242, and are separated from each other, for example by an insulating layer such as a solder resistance layer 250 (FIG. 3B). The fourth conductive elements 254 are formed between the second pad 214 and the third conductive element 252, and are separated from each other, for example by an insulating layer such as the solder resistance layer 250 (FIG. 3B).

Moreover, the first conductive element 242 electrically connects to a via-plug 246 formed through the substrate 218, and electrically connects to the first pad 212 through at least one bonding wire 240 lying across the second conductive element 244. In one embodiment, two opposing ends of the bonding wire 240 are respectively bonded on a first bonding area 248 connecting to the first pad 212 and a second bonding area 262 of the first conductive element 242. The third conductive element 252 electrically connects to a via-plug 256 formed through the substrate 218, and electrically connects to the second pad 214 through at least one bonding wire 264 lying across the fourth conductive element 254. In one embodiment, two opposing ends of the bonding wire 264 are respectively bonded on a third bonding area 258 connecting to the second pad 214 and a fourth bonding area 260 of the third conductive element 252. In one embodiment, for example, the first bonding area 248, the second bonding area 262, the third bonding area 258 and the fourth bonding area 260 are defined by (or exposed by openings of) the solder resistance layer 250 (shown in FIG. 3B, but not shown in FIG. 3A for the sake of brevity).

As disclosed above, the SMD device 220 is mounted on the substrate 218 by reflow process. In order to prevent a solder paste material from flowing into the first bonding area 248 and the third bonding area 258, a solder resistance layer (not shown) may be used to cover an area 280 between the first bonding area 248 and the first pad 212, and cover an area 282 between the third bonding area 258 and the second pad 214.

Referring to FIG. 3A, one of the first conductive element 242 and the third conductive element 252 is used for distributing a power signal and the other of the first conductive element 242 and the third conductive element 252 is used for connecting to a ground potential. For example, the first conductive element 242 is a power trace, a power ring, a power plane, or a power finger, electrically connected to the via-plug 246. The third conductive element 252 is a ground trace, a ground ring, or a ground pad, electrically connected to the via-plug 256 or to the bonding pad on a semiconductor (not shown in FIG. 3A for the sake of brevity). The second conductive element 244 and the fourth conductive element 254 are signal traces for distributing signals.

A molding compound layer 266 encapsulates structures on the substrate 218 such as the first pad 212, the second pad 214, the SMD device 220, the first conductive element 242, the second conductive element 244, etc., to protect them from mechanical and/or chemical damages, e.g. moisture, oxidization, external shocks and vibrations.

According to the present disclosure, the semiconductor package has at least following advantages. Miniaturization of IC packages is facilitated. In addition, an extra area for additional elements, devices or routing density is increased. Therefore, design flexibility of the semiconductor package is enhanced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
    a substrate;
    a first pad formed on the substrate;
    a second pad formed on the substrate;
    a first conductive element formed on the substrate;
    a surface mount device mounted on the first pad and the second pad;
    a first bonding wire electrically connecting a first bonding area of the first conductive element and a second bonding area of the first pad;
    a second conductive element formed on the substrate, and formed between the first pad and the first conductive element;
    a solder resistance layer, covering a portion of the first bonding area and a portion of the second bonding area;
    a molding compound layer encapsulating the substrate, the first pad, the second pad, the first conductive element, the second conductive element, the bonding wire and the surface mount device.

2. The semiconductor package according to claim 1, further comprising:
    a via-plug formed in the substrate and connecting to the second pad.

3. The semiconductor package according to claim 2, wherein the via-plug is covered by a solder resistance layer and located in a space between the first pad and the second pad.

4. The semiconductor package according to claim 1, further comprising:
    a third conductive element formed on the substrate; and
    a second bonding wire electrically connecting the third conductive element and the second pad.

5. The semiconductor package according to claim 4, further comprising:
    a fourth conductive element formed on the substrate, and formed between the second pad and the third conductive element;
    wherein the second bonding wire lies across the fourth conductive element.

6. The semiconductor package according to claim 4, wherein the third conductive element is a power trace, a power ring, a power plane, or a power finger.

7. The semiconductor package according to claim 1, wherein the first conductive element is a power trace, a power ring, a power plane, or a power finger.

8. A semiconductor package, comprising:
    a substrate;
    a first pad formed on the substrate;
    a second pad formed on the substrate;
    a via-plug formed in the substrate, covered by a solder resistance layer, located in a space between the first pad and the second pad, and electrically connected to the second pad;
    a surface mount device mounted on the first pad and the second pad; and
    a molding compound layer encapsulating the substrate, the first pad, the second pad, the solder resistance layer and the surface mount device.

9. The semiconductor package according to claim 8, further comprising a first conductive element formed on the substrate; and
    a first bonding wire electrically connecting the first conductive element and the first pad.

10. The semiconductor package according to claim 9, further comprising a second conductive element formed on the substrate, and formed between the first pad and the first conductive element;
    wherein the first bonding wire lies across the second conductive element.

11. The semiconductor package according to claim 9, wherein the first conductive element is a power trace, a power ring, a power plane, or a power finger.

12. The semiconductor package according to claim 8, further comprising:
    a third conductive element formed on the substrate; and
    a second bonding wire electrically connecting the third conductive element and the second pad.

13. The semiconductor package according to claim 12, further comprising:
    a fourth conductive element formed on the substrate, and formed between the second pad and the third conductive element.

14. The semiconductor package according to claim 12, wherein the third conductive element is a power trace, a power ring, a power plane, or a power finger.

* * * * *